United States Patent [19]
Ikeda

[11] Patent Number: 5,247,557
[45] Date of Patent: Sep. 21, 1993

[54] X-RAY MASK STRUCTURE, MANUFACTURING METHOD, X-RAY EXPOSURE METHOD USING SAME, AND DEVICE MANUFACTURED BY USING SAME

[75] Inventor: Tsutomu Ikeda, Hachiohji, Japan

[73] Assignee: Canon Kabushiki Kaisha, Tokyo, Japan

[21] Appl. No.: 955,266

[22] Filed: Oct. 1, 1992

[30] Foreign Application Priority Data

Oct. 4, 1991 [JP] Japan .................................. 3-284094

[51] Int. Cl.$^5$ .......................................... H01L 21/30
[52] U.S. Cl. .................................. 378/35; 378/34; 430/5
[58] Field of Search ...................... 378/34, 35; 430/5

[56] References Cited

U.S. PATENT DOCUMENTS 5,089,085  2/1992  Kashida et al. .................. 378/35
5,124,561  6/1992  Faure et al. ....................... 378/35

FOREIGN PATENT DOCUMENTS 0060839  4/1982  Japan ............................... 430/5

OTHER PUBLICATIONS

J. Vac. Sci. Technol. B4(1), Jan./Feb. 1986, pp. 221–225, 230–234.
S. Kuniyoshi et al., SPIE vol. 923, Electron-Beam, X-Ray, and Ion-Beam Technology: Submicrometer Lithographies VII, Mar. 2–4, 1988, pp. 188–196.
J. Vac. Sci. Technol. B7(6) Nov./Dec. 1989, pp. 1680–1683.
Electronics and Communications in Japan 73 (1990) Nov., No. 11, Part II, pp. 60–67.
J. Vac. Sci. Technol. B9(1) Jan./Feb. 1991, pp. 154–161.
Microelectric Engineering, vol. 6, Nos. 1–4, Dec. 1987, pp. 253–258.

*Primary Examiner*—David P. Porta
*Attorney, Agent, or Firm*—Fitzpatrick, Cella, Harper & Scinto

[57] ABSTRACT

An X-ray mask structure has an X-ray absorber, an X-ray permeable film and a frame for supporting the X-ray permeable film, wherein the X-ray absorber is made of gold having crystal orientation such that with respect to the peak strength 1 of the (200) surface, the peak strength of the (111) surface is less than 0.5 in an X-ray diffraction test. A method of manufacturing X-ray mask structures includes the step of forming the X-ray absorber, in which after an X-ray absorbing film is formed on the X-ray permeable film, heating and cooling operations are repeated a plurality of times.

23 Claims, 10 Drawing Sheets

32 X-RAY PERMEABLE FILM
31 HOLDING FRAME

34 RESIST PATTERN
35 PLATING ELECTRODE

FIG. 3(d) PRIOR ART

33 X-RAY ABSORBER

FIG. 3(e) PRIOR ART

33 X-RAY ABSORBER

X-RAY MASK STRUCTURE, MANUFACTURING METHOD, X-RAY EXPOSURE METHOD USING SAME, AND DEVICE MANUFACTURED BY USING SAME

BACKGROUND OF THE INVENTION

1. Field of the Invention

The present invention relates to an X-ray mask structure used in lithography when fine patterns for large-scale integrated (LSI) circuits, micromachines or the like are printed on wafers or the like by X-ray exposure; an X-ray mask manufacturing method; an X-ray exposure method; and a device manufactured by using the X-ray mask structure.

2. Description of the Related Art

The development of large-scale integrated circuits typified by DRAMs, 4M (Mega) DRAMs (dynamic random access memory) are now at a mass production stage. Since the technology has made a remarkable advance from 16M DRAMs to 64M DRAMs, the minimum line width required for devices has been reduced from a half micron to a quarter micron. In these semiconductor devices, fine patterns are transferred from a mask to a semiconductor substrate by using near infrared light or far infrared light. The reduction of the line width processed by the wavelength of these lights is approaching a limit. Also, deterioration of depth of focus of electron beams as patterns become finer cannot be avoided. Thus, great expectations are placed on the lithographic technology using X-rays because it simultaneously solves the above-described problems.

Figure 2:
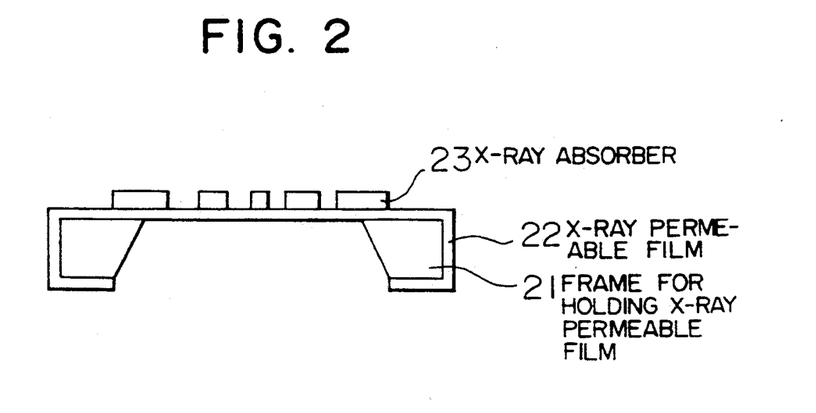
FIG. 2 is a sectional view of the mask for X-ray exposure.
Figure 3A:
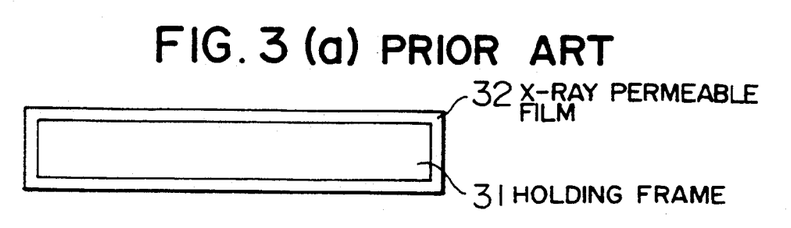
FIGS. 3a–3e show a conventional method of manufacturing X-ray masks.
Figure 3B:
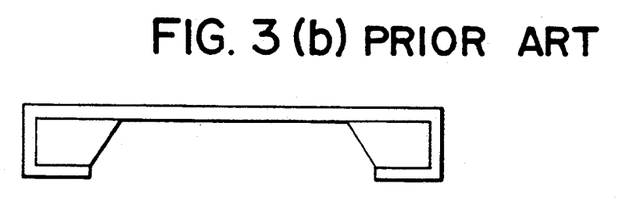
Figure 3C:
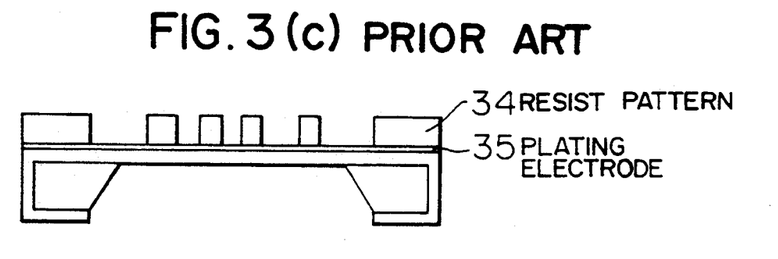
Figure 3D:
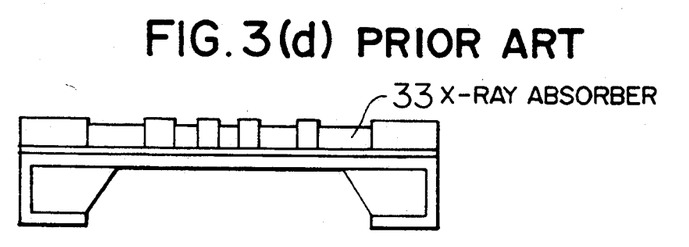
Figure 3E:
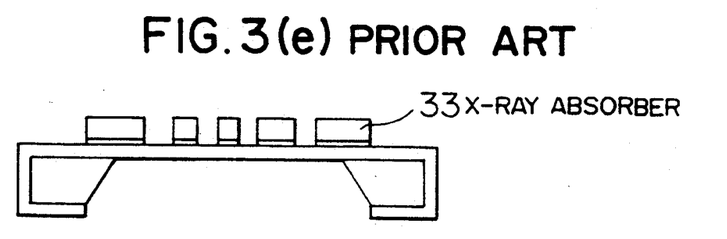

Hitherto, a large number of studies of the component materials and structure of X-ray mask structures have been presented. FIG. 2 is a sectional view illustrating a commonly used X-ray mask structure. In FIG. 2, reference numeral 21 denotes a silicon frame for holding an X-ray permeable film; reference numeral 22 denotes an X-ray permeable film; and reference numeral 23 denotes an X-ray absorber. Silicon (Si), silicon nitride (SiN), silicon carbide (SiC) or the like is used for the X-ray permeable film. Gold (Au), tantalum (Ta), tungsten (W) or the like is used as an X-ray absorber.

FIG. 3 shows an example of a conventional method of manufacturing X-ray mask structures, in which an Au plated film is used as an X-ray absorber. An X-ray permeable film 32 is formed by CVD (Chemical Vapor Deposition) to a thickness of 1 to 3 μm on an Si substrate 31 having a thickness of 1 to 5 mm (FIG. 3a). Next, the reverse surface thereof is etched by a potassium hydroxide solution or the like, so that a window is opened (FIG. 3b). After a plating electrode 35 is formed on the X-ray permeable film, a resist pattern 34 is formed (FIG. 3c). Au plating of a thickness of 0.7 to 1.0 μm is performed to form an X-ray absorber 33 (FIG. 3d). The resist and the plating electrode are peeled off, thus forming an X-ray mask structure (FIG. 3e).

Figure 4:
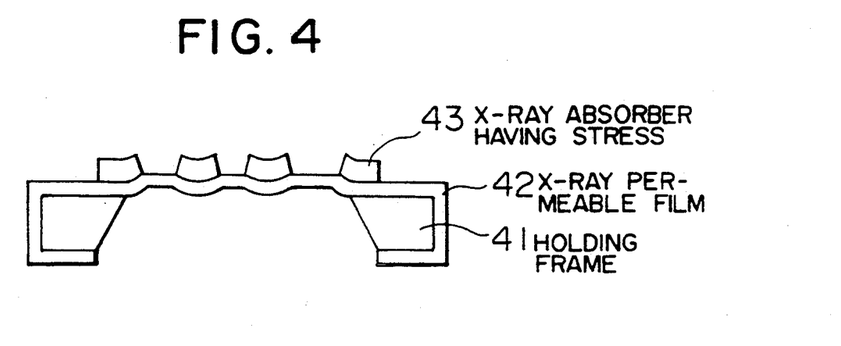
FIG. 4 is a sectional view of a deformed mask used for X-ray exposure.

It is necessary that the X-ray absorber does not deviate from the required position with respect to the X-ray permeable film manufactured in the above-described way. However, since the internal stress within the X-ray absorber cannot be controlled sufficiently hitherto, a warp occurs in the section between an X-ray absorber 43 and an X-ray permeable film 42, causing a positional deviation of the X-ray absorber, as shown in FIG. 4.

Therefore, a method has been used in which heat treatment (an annealing operation) is performed on a gold plated film forming an X-ray absorber, and thus reducing the internal stress of the gold plated film. It has been reported that it is relatively easy to control the stress of a gold plated film and to form a low-stress film [see K. Suzuki, et al., J. Vac. Sci. Technol. B4(1), pp. 221–225, 1986]. It has also been reported that the stress value of a gold plated film can be changed by heat treatment at a temperature between approximately 20°, 30° C. and 120°, 130° C. (see K. -H, Muller, et al., J. Vac. Sci. Technol. B4, pp. 230–234, 1986, S. Kuniyoshi, et al., SPIE Vol.923, Electron-Beam, X-ray, and Ion-Beam Technology: Submicrometer Lithographies II pp. 188–196, 1988, and 37th Annual Spring Applied Physics Conference Preliminary Manuscript Vol. 2, p. 489).

It is believed that the reason that the stress is changed by heat treatment at temperatures between approximately 20°, 30° C. and 120°, 130° C. is that $H_2$, occluded during plating, is released. In addition, it has been reported that the stress of a gold plated film is reduced by aging.

Therefore, the inventors of the present invention attempted to form a gold plated film which has a low stress by virtue of heat treatment or aging. They formed a resist pattern within a square of 30 mm$^2$ on an X-ray permeable film and plated it with gold. This was heat treated at a temperature of, for example, 70° to 100° C. at which temperature, there is an expectation of low stress; or the film stress was reduced by aging. Thereafter, the positional deviation of the gold plated film was measured by a length measuring SEM (Scanning Electron Microscope).

The results showed that the pattern produced by the above process is relatively satisfactory in terms of the overall positional accuracy, but large positional deviations occurred locally. When, for example, the 30 mm hole was measured at 400 points (20×20), most points showed positional deviations of less than 0.03 μm, but some points (approximately 5 to 10% depending upon the experiment) showed large positional deviations of 0.05 to 0.12 μm.

Since X-ray lithography used with X-ray mask structures aims for a resolution of 0.25 μm, a resolution of 0.25 μm and pattern positional accuracy of less than 0.03 μm in a 30 mm hole are required for the X-ray mask structure. Therefore, the aforesaid positional deviation of 0.05 to 0.12 μm in the 30 mm hole is a major problem.

That is, in the prior art and in the teachings of K. -H, Muller, et al., J. Vac. Sci. Technol. B4, pp. 230–234, 1986, S. Kuniyoshi, et al., SPIE Vol. 923, Electron-Beam, X-ray, and Ion-Beam Technology: Submicrometer Lithographies II pp. 188–196, 1988, and 37th Annual Spring Applied Physics Conference Preliminary Manuscript Vol. 2, p. 489, the stress of the plated film on a Si wafer substrate or the like is computed by using the amount of the warp thereof. In other words, the stress of the plated film computed is an average value of the stress of the entire plated film. However, a low stress based on such an average value has no significance in controlling the stress of an X-ray mask. Rather, every region of the plated film must have low stress.

SUMMARY OF THE INVENTION

A first object of the present invention is to solve the above-mentioned problems in the prior art by providing an X-ray mask structure, having an X-ray absorber pattern, the entire X-ray absorber patterned film of which is uniformly formed with low stress, and having a small amount of positional deviations, and a method of manufacturing the same.

A second object of the present invention is to provide an X-ray exposure method capable of transferring high-resolution patterns by using an X-ray mask structure.

A third object of the present invention is to provide a highly integrated device which is manufactured using the X-ray mask structure and which has excellent, stable characteristics.

A fourth object of the present invention is to provide an X-ray mask structure comprising an X-ray absorber, an X-ray permeable film and a frame for supporting the X-ray permeable film, wherein the X-ray absorber is formed of gold. The X-ray absorber has a crystal orientation having an X-ray diffraction peak strength ratio (111)/(200) of less than 0.5.

A fifth object of the present invention is to provide an X-ray exposure method, comprising providing an X-ray mask structure comprising an X-ray absorber having a pattern, an X-ray permeable film, and a frame for supporting the X-ray permeable film, wherein the X-ray absorber is formed of gold and has a crystal orientation having an X-ray diffraction peak strength ratio (111)/(200) of less than 0.5; exposing a member with X-ray through the X-ray mask structure; and transferring the pattern of the X-ray absorber to the member.

A sixth object of the present invention is to provide a device manufactured by the process comprising the steps of (i) providing an X-ray mask structure comprising an X-ray absorber having a pattern, an X-ray permeable film, and a frame for supporting the X-ray permeable film, wherein the X-ray absorber is formed of gold and has a crystal orientation having an X-ray diffraction peak strength ratio (111)/(200) of less than 0.5; exposing a member with X-ray through the X-ray mask structure; transferring the pattern of the X-ray absorber to the member; and fabricating the member. A seventh object of the present invention is to provide a method of manufacturing an X-ray mask structure, comprising: (i) forming an X-ray permeable film on a frame; (ii) forming an X-ray absorber on the X-ray permeable film; and (iii) heating an cooling the X-ray absorber a plurality of times.

Other objectives, features, and advantages in addition to those discussed above will become more apparent from the following detailed description of the preferred embodiments considered in conjunction with the accompanying drawings.

DESCRIPTION OF THE PREFERRED EMBODIMENTS

First, the inventors of the present invention conducted an investigation to find out the reasons why positional deviations occur locally in an X-ray absorber pattern.

Figure 5:
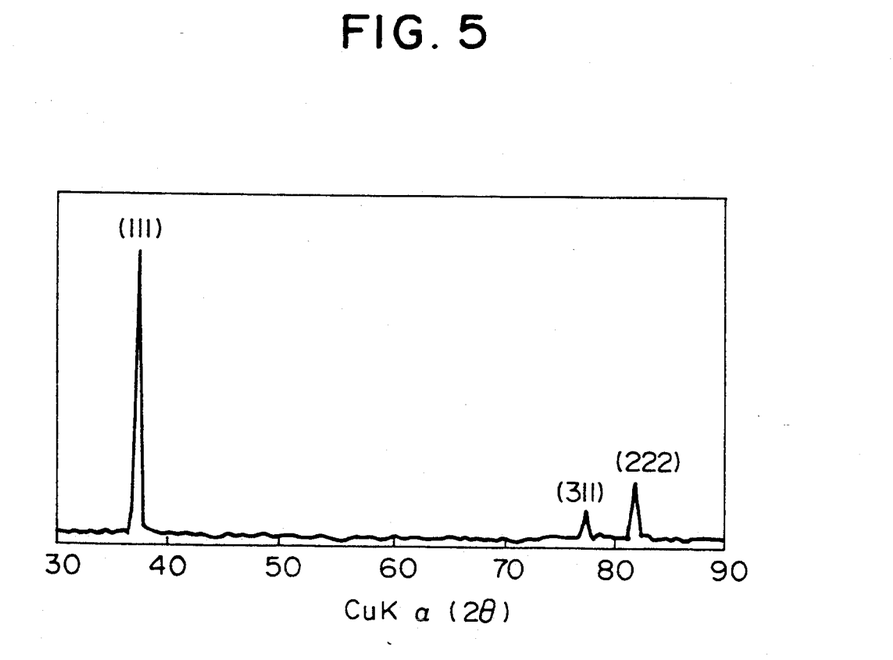
FIG. 5 is a view of X-ray diffraction of a gold absorber.

When an electrode of gold, copper or the like, formed on an Si wafer, was plated with gold by using a sulfite type gold plating solution, a film formed as a result of the gold plating became a (111) oriented film, as shown in FIG. 5. At this time, the thickness of the plated film was 0.7 $\mu$m, which is the thickness most appropriate for an X-ray mask. The stress thereof was $-6E+8$ dyn/cm$^2$ (compression).

Figure 8:
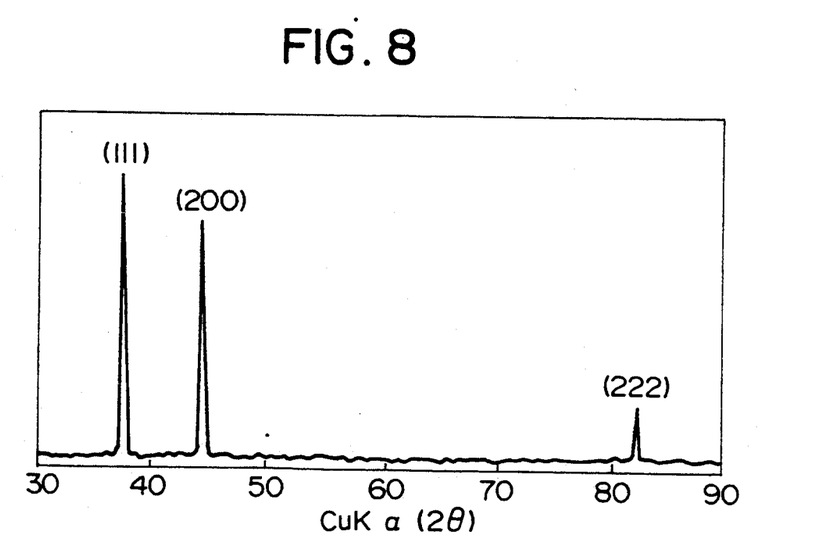
FIG. 8 illustrates the relationship between heat treatment (stress reduction) and changes of crystal orientation.
Figure 9:
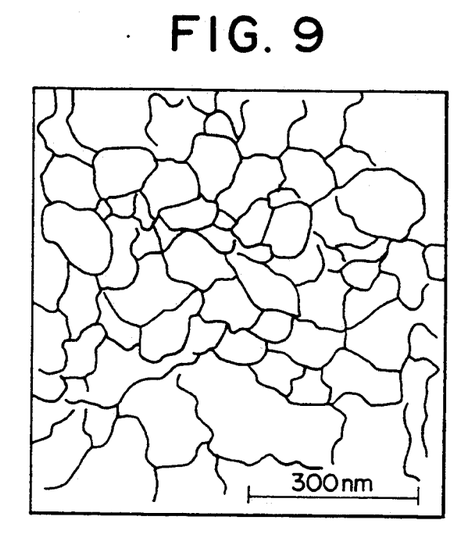
FIG. 9 illustrates a SEM image before heat treatment.
Figure 10:
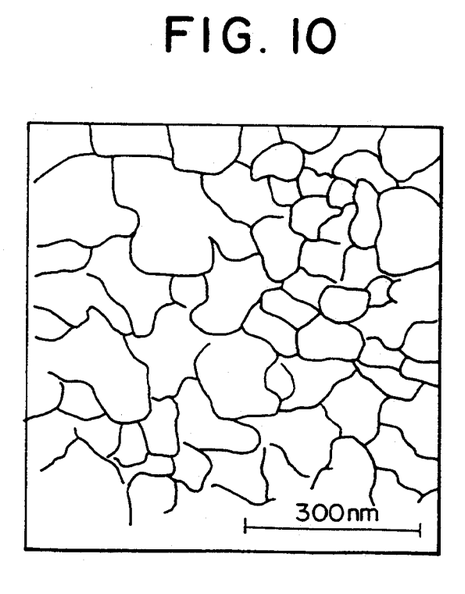
FIG. 10 illustrates a SEM image after heat treatment.
Figure 11:
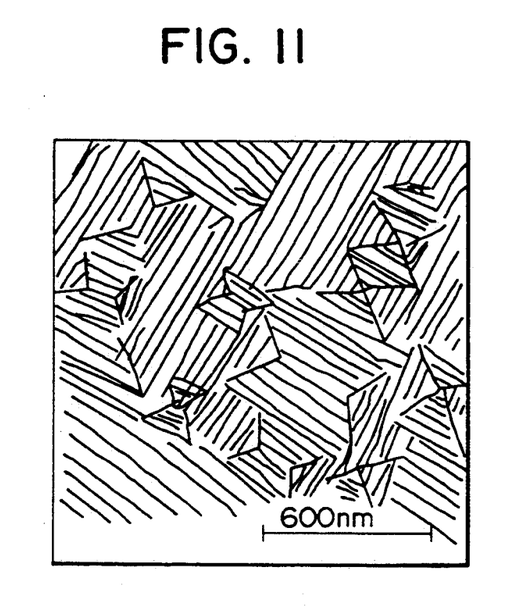
FIG. 11 illustrates a SEM image after heat treatment.

When heat treatment was performed to reduce the stress of the plated film having a compressive stress, the orientation of crystals changed from (111) to (200), as shown in FIG. 8. At this time, the stress showed a very small value of less than $5E+7$ dyn/cm$^2$. Next, this film was observed by a scanning electron microscope (SEM). An SEM image before heat treatment was performed on the plated film is shown in FIG. 9. The SEM image after heat treatment was performed on the plated film is shown in FIGS. 10 and 11. Before the heat treatment was performed on the plated film, it had a granular appearance over the entire surface thereof, as shown in FIG. 9. On the other hand, after the heat treatment, two types of images were mixed together, as shown in FIGS. 10 and 11. The SEM image in FIG. 11 having the form of an island exists in the SEM image in FIG. 10. Moreover, the distribution of the two types of images was not uniform, but localized. Regarding these two types of images, FIG. 10 illustrates a (111) oriented film and FIG. 11 illustrates a (200) oriented film.

Hereupon, a plurality of films having a stress of approximately $-6E+8$ dyn/cm$^2$ were manufactured under the same conditions. After all of them were annealed at 100° C., an X-ray diffraction test was carried out. The results of the test showed that the strength of the (111) surface of the plated film was between 0.8 and 2.0 with respect to the peak strength ratio 1 of the (200) surface. The distribution of the (200) oriented surface was not uniform.

It became evident, due to the above results, to the inventors of the present invention that, in the conventional heat treatment for obtaining low stress, the entire plated film was not formed with a low stress at all from the standpoint of the crystal structure of the plated film. That is, reduction of stress by heat treatment occurred as a result of the crystal structure changing from the (111) orientation to the (200) orientation. Since this change occurred nonuniformly within the film, it is believed that a large positional deviation occurred in regions where the amount of (111) orientation remained relatively large.

Figure 12:
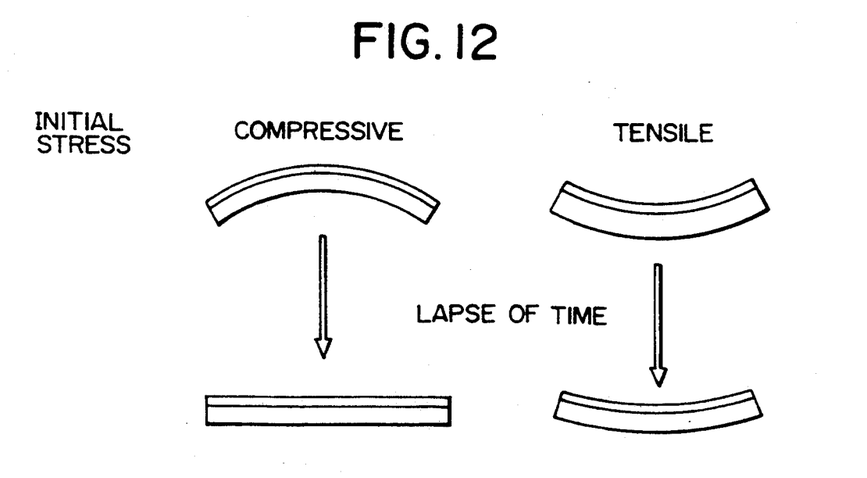
FIG. 12 illustrates changes of the stresses of a gold plated film and a substrate after a lapse of time.

Also, the inventors of the present invention obtained the following investigation results concerning the changes of the crystal structure. The movements of the gold plated film and the substrate during aging are shown in FIG. 12. During aging, when the film had an initial stress which was compressive or when the film had an initial stress which was tensile, the stress of the gold plated film was reduced while the crystal structure thereof was partially changed from (111) to (200) by a stress from the substrate. At this time, the stress of the film when its initial stress was compressive was reduced approximately to zero due to aging. In contrast, the stress of the film whose initial stress was tensile did not reduce to zero.

Figure 13:
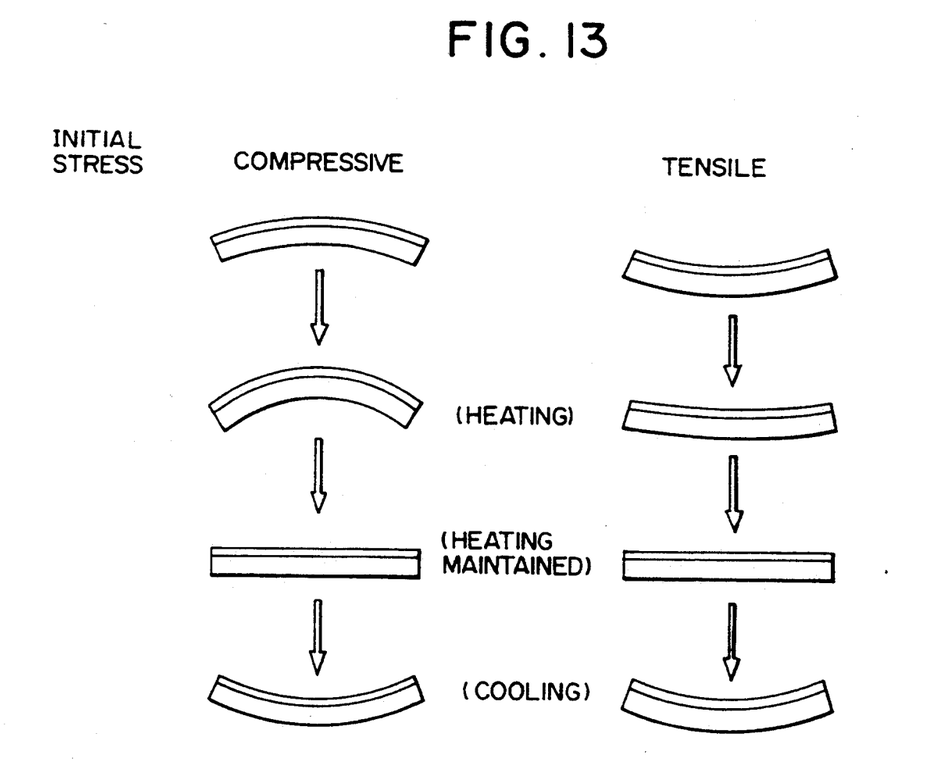
FIG. 13 illustrates movements of the gold plated film and the substrate during heat treatment.

The movements of the gold plated film and the substrate during heat treatment thereon are shown in FIG. 13. During the heat treatment, since the thermal expansion coefficient of gold differs from that of the substrate (in bulk values, Au: 15E-6, Si:2.4E-6), in the film when its initial stress was, for example, compressive, immediately after it was heated, a greater compressive stress than before developed. However, immediately after this, the gold plated film experienced a stress reduction similar to that observed during aging. The stress value approached zero at the heating temperature. Thereafter, when the gold plated film was cooled and returned to room temperature, it developed a tensile stress due to heat stress. The change of the crystal structure from (111) orientation to (200) orientation occurred when the stress of the gold plated film was reduced during heating, and while it hardly changed during the time it was cooled. On the other hand, when the film's initial stress was tensile, since the initial tensile stress was changed to a weak compressive stress by heating at such a temperature as approximately 100° C. ,the influence of the stress upon the gold plated film was smaller than upon the film when its initial stress was compressive. As a result, the amount that the crystal structure changed from the (111) to (200) orientation was quite small.

Figure 14:
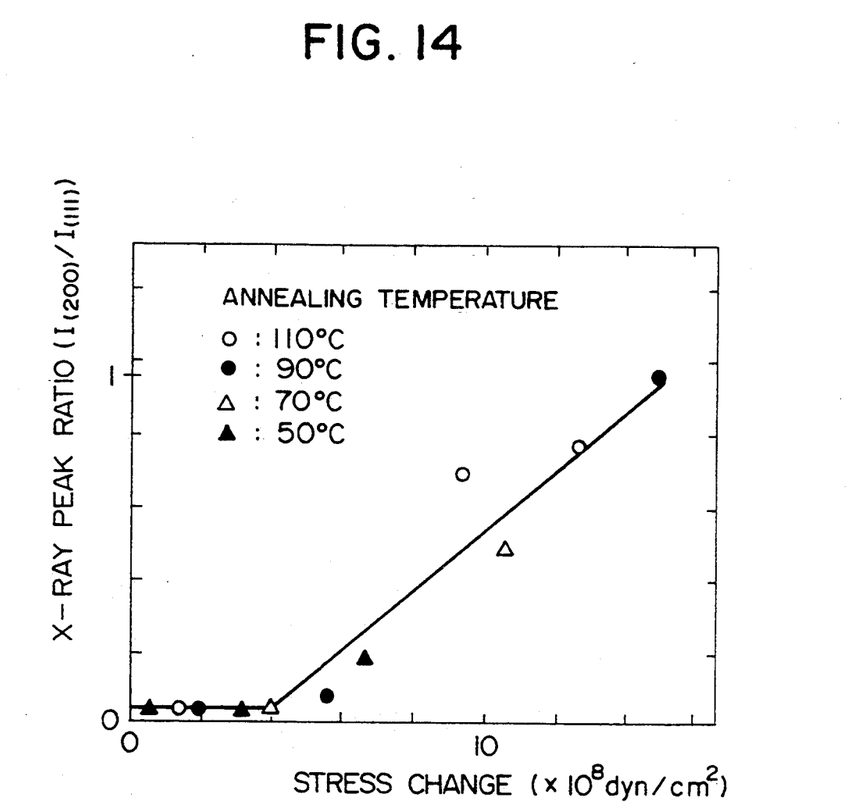
FIG. 14 illustrates the relationship between changes of stress and changes of crystal structure.

FIG. 14 illustrates the relationship between the amount of change of the stress and the amount that the crystal structure changed. Plotted on a vertical axis is the X-ray diffraction peak strength ratio of the (111) orientation of the gold plated film to the (200) orientation thereof. The amount of change of the stress during an annealing time is plotted on a horizontal axis.

It can be seen from FIG. 14 that only the stress changes in the initial period and that the crystal structure changes only when the stress is changed. In an annealing operation for making the stress zero in the prior art, the amount of stress change was approximately 1E+9 dyn/cm² at most.

Even if the substrate was cooled, the movement of the substrate during the time it was heated is the same as when it was cooled. When a gold plated substrate was put into liquified nitrogen and the movement thereof was observed, the film having an initial stress which was tensile changed to a film whose stress of the film was compressive, it was changed to a film whose stress is more compressive than before. The amount that the crystal structure changed from the (111) orientation to the (200) orientation was greater when initial stress of the film was tensile.

The following became clear from the above results.

According to the investigation conducted by the inventors of the present invention, it became clear that the change in the amount of the stress of a gold plated film during aging and heat treatment thereof is not related to the release of elements or absorption of elements due to any reaction, as has been believed thus far, but occurs only due to the force relationship between the film and the substance. Also, the heat was not a direct cause of the stress change. The amount of stress of the gold plated film is changed easily by an outside stress and thus the crystal structure thereof changes. The change of the crystal structure of the gold plated film is not caused by heat only.

As described above, the stress reduction due to heat treatment occurs during the change from the (111) to the (200) orientation. Since this change occurs nonuniformly within the film, a large positional deviation occurs in local regions where the change amount is small. This means that a local positional deviation can be suppressed if the (111) orientation is changed to the (200) orientation by an amount sufficient enough to reduce (111) orientation and the change is distributed uniformly within the film even if the local positional deviation exists.

The above-described problems of the prior art are solved by the present invention, which uses an absorber in which the crystal orientation is made uniform within the film. In the present invention, an X-ray absorber is heated and cooled repeatedly in order to change the film of the (111) orientation until the X-ray absorber is fully saturated to the (200) crystal orientation, thereby eliminating the orientation nonuniformity and a local positional deviations in the X-ray absorber.

As described above, to change the X-ray absorber until it is changed into a fully saturated state of (200) orientation, it is necessary that operation steps of a heating operation and a cooling operation be performed repeatedly a plurality of times after the X-ray absorber is formed on a substrate until the crystal orientation change is fully saturated. That is, repeating the operation steps a plurality of times permits a large stress change to be caused in the X-ray absorber, unlike in the case of a conventional annealing operation. Therefore, a large change of the crystal structure can also be obtained. The heating operation should be performed at a temperature higher than the operating temperature for an X-ray mask. However, if the temperature is too high, gold is diffused within the substrate, while, if it is too low, the heating operation takes a long time. Thus, a temperature ranging from 30 to 300° C. should be used. In contrast, the cooling operation should be performed at a temperature lower than the heating temperature. However, if the temperature is too high, the number of times the operation has to be repeated becomes large since the amount of the change of the crystal structure is small Thus, preferably a temperature lower than 0° C. should be used. Any heating device can be used for the annealing operation, but usually, a hot plate, an oven or the like is used. In the cooling operation, gas, such as nitrogen or argon, is cooled by an ordinary method, and the X-ray mask is cooled by using this gas as a medium. Also, a solvent, such as alcohol or acetone, may be used as a medium. The use of liquefied nitrogen enables the cooling time to be shortened considerably.

To obtain a large stress change of the X-ray absorber, it is particularly preferable that the line expansion coefficient of a substrate on which the X-ray absorber is formed be one half of or less than that of the X-ray absorber.

In the method of manufacturing X-ray mask structures, manufacturing steps other than the above-mentioned step of manufacturing X-ray absorbers, for example, the step of forming X-ray permeable films or the step of producing holding frames, which are well known, are performed.

Explanation will now be given about other structural materials of the X-ray mask structure of the present invention.

The X-ray permeable film is preferably formed to a thickness between 1 and 10 $\mu$m to reduce the deviation between the designed line width and a transfer line width as much as possible. The X-ray permeable film is formed from well-known materials, such as inorganic films made of Si, $SiO_2$, SiC, SiN, SiCN, BN, or BNC, or radiation resistant organic films, such as polyimide. The X-ray absorber which absorbs X-rays is usually formed to a thickness of 0.2 to 1.0 $\mu$m. The frame for supporting an X-ray permeable film is formed by a silicon wafer or the like. Moreover, a holding frame for assisting the transport of a mask substrate may be provided on the supporting frame. This supporting frame is formed from materials of heat resistant glass, Ti, an Fe-Co alloy, ceramics, or the like. A film for protecting an X-ray absorber, an electroconductive film, a film for preventing alignment light from being reflected or the like may be provided on the X-ray mask structure of the present invention.

Further, the present invention has a feature in that the X-ray exposure method and the device of the present invention uses an X-ray mask structure having the above-described structure. The X-ray exposure method of the present invention comprises the step of transferring X-ray absorber patterns to a member to be transferred by exposing the member to be transferred with X-rays via the X-ray mask structure. The device of the present invention is manufactured by exposing a substrate to be processed with X-rays via the X-ray mask structure to transfer an X-ray absorber pattern to the substrate to be processed and by processing and fabricating the substrate. The X-ray exposure of the present invention may be a conventional, well-known method except that the X-ray mask structure of the present invention is used. Also, the device of the present invention is a device manufactured by a conventional, well-known method except that the X-ray mask structure of the present invention is used.

Next, the present invention will be explained more specifically with reference to the following embodiments.

First Embodiment

A silicon nitride film was formed to a thickness of 2 $\mu$m on an Si substrate having a thickness of 2 mm by a CVD method. Next, the silicon nitride film on the reverse surface thereof was etched to a predetermined shape by a dry etching process. Then, Si was etched by a potassium hydroxide solution with the silicon nitride film on the reverse surface as a mask to open a window.

Cr (5 nm) and Au (50 nm) were used to form a film in succession on an X-ray permeable film (on the surface of the silicon nitride) by EB vapor deposition so as to serve as plating electrodes. Then, a resist pattern was formed on the electrode. Au plating of a thickness of 0.7 $\mu$m was performed with this resist pattern as a stencil, thus forming an X-ray absorber. At this time, according to the X-ray diffraction test, the gold plated film was a (111) crystal oriented film having an internal stress of $-5E+8$ $dyn/cm^2$ (compressive stress).

The resist was peeled off, thus forming an X-ray mask. Next, the X-ray mask was heated at 120° C. for one hour. After it was cooled to room temperature, an X-ray diffraction test was carried out. The results of the test showed that the gold plated film has an internal stress of $+10E+8$ $dyn/cm^2$ (tensile stress) and the (111) was 2.5 with respect to the peak strength 1 of the (200) regarding the crystal orientation of the gold-plated film.

Then, the X-ray mask was cooled in liquefied nitrogen for one hour. After it is heated to room temperature, an X-ray diffraction test was carried out. The results of the test showed that the gold-plated film has an internal stress of $-2E+8$ $dyn/cm^2$ and the (111) was 1.1 with respect to the peak strength 1 of the (200) orientation regarding the crystal orientation of the gold-plated film.

Figure 1:
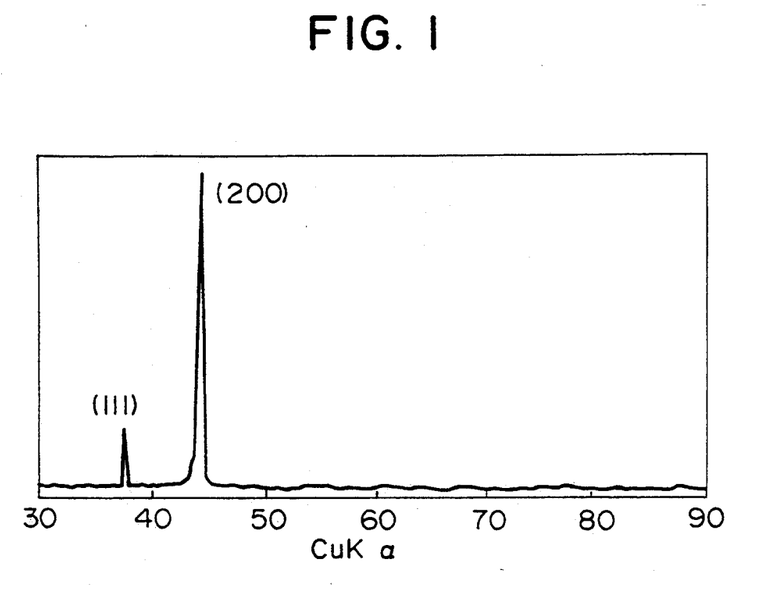
FIG. 1 is a view of X-ray diffraction of a gold absorber of a mask used for X-ray exposure according to the present invention.

When the above operation was repeated two times, the (111) was 0.2 with respect to the peak strength 1 of (200) regarding the crystal orientation. After this, the strength ratio hardly changed even if the operation was repeated (FIG. 1). When the X-ray mask was heated at 70° C. for half hour after the final operation, the internal stress showed a value of $-0.5E+8$ $dyn/cm^2$. When the positional deviation of the X-ray mask was measured, it was less than 0.03 $\mu$m in a 30 mm hole (at all of 400 measurement points), which is smaller than the measurement accuracy of the apparatus. A measuring SEM (EM-1000 manufactured by Hitachi, Ltd.) was used as the measuring apparatus.

Second Embodiment

An experiment similar to that of the first embodiment, except that the temperature and the number of times of the operation are changed, was carried out. The results thereof are shown in Table 1 below.

TABLE 1

| Heating operation | | Cooling operation | | Number of times of repetition | Final heating operation | | X-ray diffraction peak strength ratio (111/200) | Maximum positional deviation (30 mm hole, 400 points, $\mu$m) |
| --- | --- | --- | --- | --- | --- | --- | --- | --- |
| Temp. (°C.) | Time (hr) | Temp. (°C.) | Time (hr) | | Temp. (°C.) | Time (hr) | | |
| 120 | 2 | −196 | 2 | 4 | 70 | 0.7 | 0.32 | 0.03 |
| 180 | 1 | −196 | 1 | 3 | 70 | 0.5 | 0.20 | 0.03 |
| 180 | 1 | −40 | 4 | 6 | 50 | 1.0 | 0.30 | 0.03 |
| 120 | 1 | −40 | 4 | 8 | 50 | 1.0 | 0.33 | 0.03 |
| 90 | 2 | −196 | 1 | 5 | 70 | 0.5 | 0.25 | 0.03 |
| 100 | 2 | −60 | 2 | 5 | 60 | 0.3 | 0.35 | 0.03 |
| 200 | 1 | −60 | 3 | 3 | 60 | 0.3 | 0.22 | 0.03 |
| 200 | 1 | −196 | 2 | 5 | 70 | 0.7 | 0.18 | 0.03 |

Third Embodiment

Figure 15:
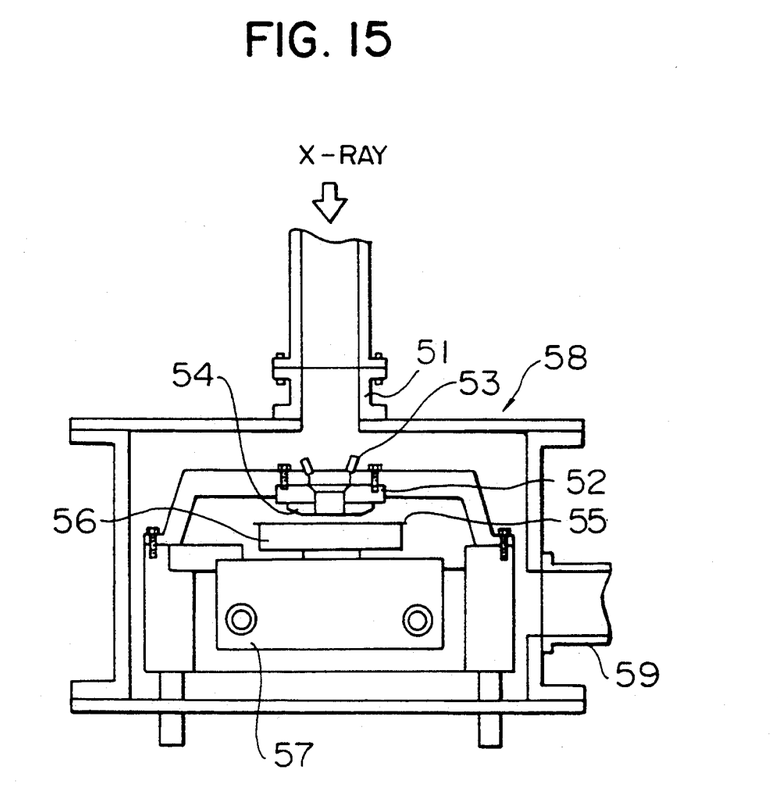
FIG. 15 is a simplified illustration of the X-ray exposure apparatus.

FIG. 15 is a simplified illustration of the X-ray exposure apparatus. Reference numeral 8 denotes an exposure chamber; reference numeral 1 denotes a beryllium (Be) port; and reference numeral 9 denotes an exhaust port. The exposure chamber 8 is shut off from an X-ray generation source by Be. Exposure is possible inside the chamber when the inside thereof contains any of the following: air, a vacuum, He atmosphere or the like.

Reference numeral 52 denotes a mask stage; reference numeral 53 denotes an alignment detection section; reference numeral 54 denotes an X-ray mask structure; reference numeral 55 denotes a wafer (semiconductor substrate); reference numeral 56 denotes a wafer chuck; and reference numeral 57 denotes a wafer stage.

The X-ray mask structure 54 is mechanically set in a direction predetermined to some degree by using a positioning pin, orientation flat or the like when the X-ray mask structure 54 is attached to the mask stage 52. The wafer 55 is set in the wafer chuck 56 in a similar manner. Thus, the relative positional relationship between the X-ray mask structure 54 and the wafer 55 is determined by an instruction from the alignment detection section 53. Thereafter, they are exposed by X-rays.

In an X-ray exposure which uses the X-ray mask structure of the present invention and the X-ray exposure apparatus shown in FIG. 15, the positional deviation of the pattern was less than 0.03 $\mu$m, which is the measurement accuracy of the apparatus, and a high-accuracy semiconductor device could be manufactured.

According to the present invention, as described above in detail, the X-ray absorber was heated and cooled repeatedly in a mask used for X-ray exposure, the mask being formed of an X-ray absorber, an X-ray permeable film and a member for supporting the X-ray permeable film, so that the crystal structure thereof is fully changed from (111) orientation to (200) orientation. Thereafter, the gold plated film is heat treated to have low stress, thus a pattern having a small amount of positional deviations could be formed.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded the broadest interpretation, so as to encompass all possible modifications and equivalent structures and functions.

What is claimed is:

1. An X-ray mask structure comprising an X-ray absorber, an X-ray permeable film and a frame for supporting the X-ray permeable film, wherein the X-ray absorber is formed of gold, said X-ray absorber has a crystal orientation having an X-ray diffraction peak strength ratio (111)/(200) of less than 0.5.

2. An X-ray mask structure according to claim 1, wherein the line expansion coefficient of the X-ray permeable film is one half of that of the X-ray absorber.

3. An X-ray mask structure according to claim 1, wherein the X-ray diffraction peak strength ratio (111)/(200) is less than 0.35.

4. An X-ray mask structure according to claim 1, wherein the X-ray permeable film is a silicon nitride film.

5. An X-ray mask structure according to claim 1, wherein the thickness of the X-ray permeable film is between 1 $\mu$m and 10 $\mu$m, and thickness of the X-ray absorber is between 0.2 $\mu$m and 10 $\mu$m.

6. An X-ray exposure method, comprising (i) providing an X-ray mask structure comprising an X-ray absorber having a pattern, an X-ray permeable film, and a frame for supporting the X-ray permeable film, wherein said X-ray absorber is formed of gold and has a crystal orientation having an X-ray diffraction peak strength ratio (111)/(200) of less than 0.5;

(ii) exposing a member with X-ray through said X-ray mask structure; and (iii) transferring the pattern of said X-ray absorber to said member.

7. An X-ray exposure method according to claim 6, wherein the line expansion coefficient of the X-ray permeable film is one half of that of the X-ray absorber.

8. An X-ray exposure method according to claim 6, wherein the X-ray diffraction peak strength ratio (111)/(200) is less than 0.35.

9. An X-ray exposure method according to claim 6, wherein the X-ray permeable film is a silicon nitride film.

10. An X-ray exposure method according to claim 6, wherein the thickness of the X-ray permeable film is between 1 $\mu$m and 10 $\mu$m, and thickness of the X-ray absorber is between 0.2 $\mu$m and 1.0 $\mu$m.

11. A device manufactured by the process comprising the steps of:

(i) providing an X-ray mask structure comprising an X-ray absorber having a pattern, an X-ray permeable film and a frame for supporting the X-ray permeable film, wherein said X-ray absorber is formed of gold and has a crystal orientation having an X-ray diffraction peak strength ratio (111)/(200) of less than 0.5;

(ii) exposing a member with X-ray through said X-ray mask structure;

(iii) transferring the pattern of said X-ray absorber to said member; and (iv) fabricating said member.

12. A device according to claim 11, wherein the line expansion coefficient of the X-ray permeable film is one half of that of the X-ray absorber.

13. A device according to claim 11, wherein the X-ray diffraction peak strength ratio (111)/(200) is less than 0.35.

14. A device according to claim 11, wherein the X-ray permeable film is a silicon nitride film.

15. A device according to claim 11, wherein the thickness of the X-ray permeable film is between 1 $\mu$m and 10 $\mu$m, and thickness of the X-ray absorber is between 0.2 $\mu$m and 1.0 $\mu$m.

16. A method of manufacturing an X-ray mask structure comprising:

(i) forming an X-ray permeable film on a frame; 0 (ii) forming an X-ray absorber on said X-ray permeable film; and (iii) heating and cooling said X-ray absorber a plurality of times.

17. A method of manufacturing an X-ray mask structure according to claim 16, wherein the X-ray absorber is formed of a gold film.

18. A method of manufacturing an X-ray mask structure according to claim 17, wherein the gold film is formed by plating.

19. A method of manufacturing an X-ray mask structure according to claim 17, wherein said heating and cooling steps are repeated a plurality of times until the (200) orientation of the gold film reaches its saturation.

20. A method of manufacturing an X-ray mask structure according to claim 17, wherein said heating and cooling steps are repeated a plurality of times until the gold film has a crystal orientation having an X-ray diffraction peak strength ratio (111)/(200) of less than 0.5.

21. A method of manufacturing an X-ray mask structure according to claim 16, further comprising forming an X-ray permeable film having a line expansion coefficient which is one half of that of the X-ray absorber.

22. A method of manufacturing an X-ray mask structure according to claim 16, wherein said heating is conducted at a temperature of between 30° to 300° C.

23. A method of manufacturing an X-ray mask structure according to claim 16, wherein said cooling is conducted at a temperature below 0° C.

* * * * *

UNITED STATES PATENT AND TRADEMARK OFFICE
CERTIFICATE OF CORRECTION

PATENT NO. : 5,247,557

DATED : September 21, 1993

INVENTOR(S) : TSUTOMU IKEDA

It is certified that error appears in the above-identified patent and that said Letters Patent is hereby corrected as shown below:

On drawing sheet

SHEET 4 OF 10

Figure 6:
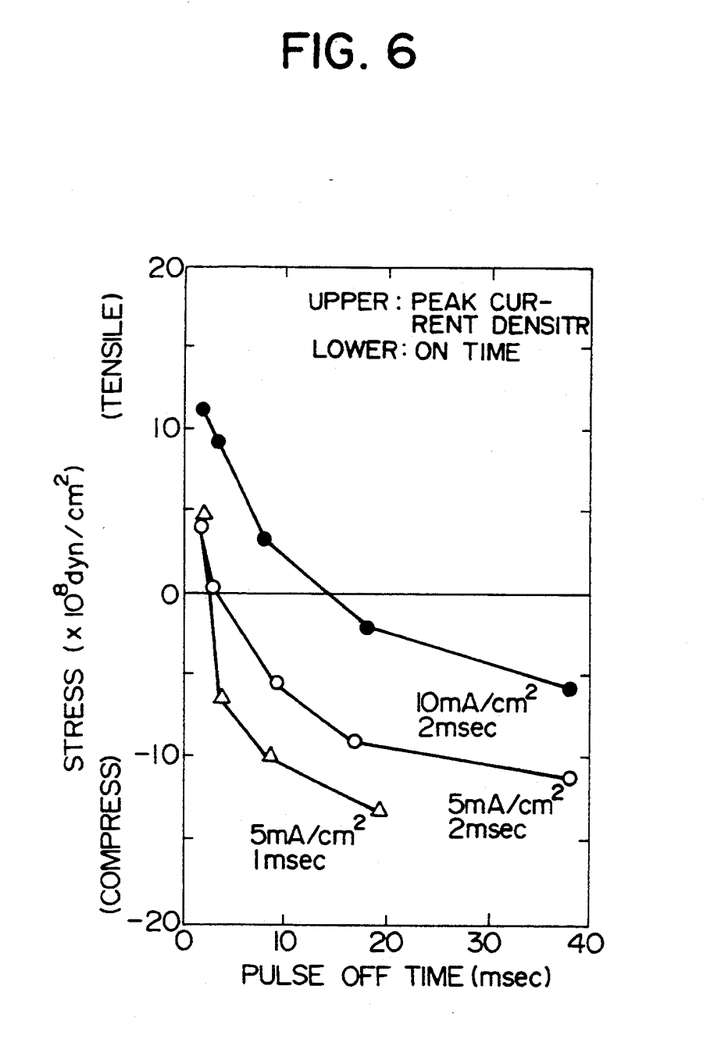
FIG. 6 illustrates the relationship between plating conditions and the stress of a plated film.
Figure 7:
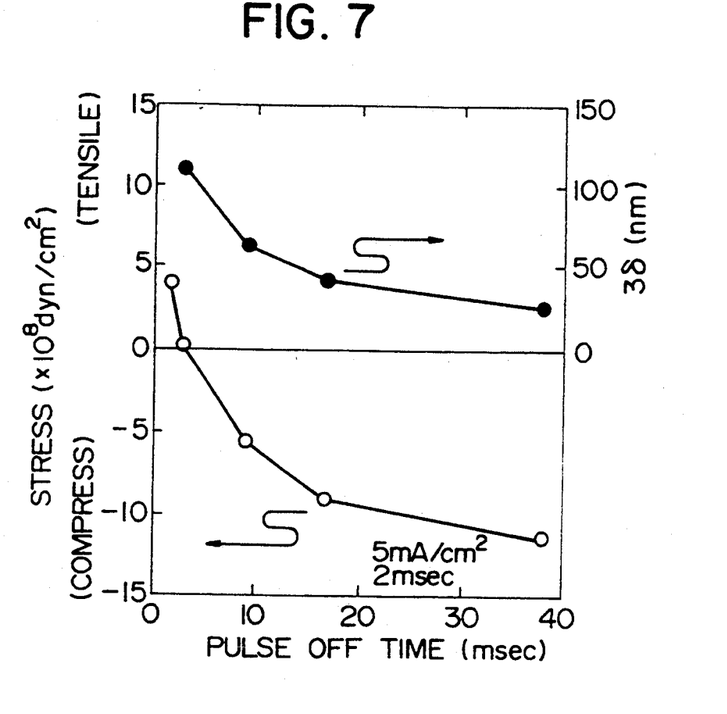
FIG. 7 illustrates the relationship between stress values and film thickness distribution.

FIG. 6, "DENSITR" should read --DENSITY--.

COLUMN 3

Line 39, "member. A" should read --member. ¶ A--.
Line 44, "an" should read --and--.

COLUMN 5

Line 60, "stress of" should read --stress was compressive after the cooling treatment using liquified nitrogen was performed. In contrast, when the initial stress of--.

COLUMN 6

Line 30, "a" should be deleted.

COLUMN 8

Line 9, "electrode." should read --electrodes.--.
Line 67, "numeral 8" should read --numeral 58--.
Line 68, "numeral 1" should read --numeral 51--.

COLUMN 9

Line 1, "numeral 9" should read --numeral 59--.
Line 2, "chamber 8" should read --chamber 58--.
Line 68, "comprising" should read --comprising:--.

UNITED STATES PATENT AND TRADEMARK OFFICE
CERTIFICATE OF CORRECTION

PATENT NO. : 5,247,557
DATED : September 21, 1993
INVENTOR(S) : TSUTOMU IKEDA

It is certified that error appears in the above-identified patent and that said Letters Patent is hereby corrected as shown below:

COLUMN 10

Line 54, "frame; 0 (ii)" should read --frame; ¶ (ii)--.

Signed and Sealed this

Twenty-sixth Day of July, 1994

Attest:

BRUCE LEHMAN

Attesting Officer    Commissioner of Patents and Trademarks